(12) United States Patent
Rose et al.

(10) Patent No.: US 6,197,843 B1
(45) Date of Patent: Mar. 6, 2001

(54) METHOD FOR PREPARING CERAMIC ARTICLES

(75) Inventors: Gene D Rose, Midland, MI (US); Robert K Prud'homme, Princeton Junction, NJ (US); Gordon D McCann; Donald L Schmidt, both of Midland, MI (US); Iihan A Aksay; Rajeev Garg, both of Princeton, NJ (US)

(73) Assignees: The Dow Chemical Company, Midland, MI (US); Princeton University, Princeton ( * ) Notice: Subject to any disclaimer, the term of this patent is extended or adjusted under 35 U.S.C. 154(b) by 0 days.

(21) Appl. No.: 08/846,764

(22) Filed: Apr. 30, 1997

Related U.S. Application Data

(60) Provisional application No. 60/016,561, filed on Apr. 30, 1996.

(51) Int. Cl.$^7$ .................. C08J 3/28; C08J 7/04; C08K 3/22; C08K 3/36
(52) U.S. Cl. .................. 522/83; 522/84; 522/85; 522/31; 524/2; 524/5; 524/430; 524/434; 524/802; 524/815; 524/816; 524/845; 430/269; 430/281.1; 430/286.1
(58) Field of Search .................. 522/84, 85, 86, 522/87, 83; 524/2, 5, 802, 845, 430, 434, 413, 428, 815, 816; 430/269, 286.1, 281.1

(56) References Cited

U.S. PATENT DOCUMENTS

| | | |
|---|---|---|
| 3,636,052 | 1/1972 | Hatch et al. . |
| 3,723,386 | 3/1973 | Hatch et al. . |
| 4,089,877 | 5/1978 | Klingler et al. . |
| 4,118,297 | 10/1978 | Broxterman et al. . |
| 4,582,663 | 4/1986 | Pickelman et al. . |
| 4,968,433 | 11/1990 | Schmidt et al. . |
| 5,310,581 | 5/1994 | Schmidt et al. . |

OTHER PUBLICATIONS

Bacchetti, L. F. et al., "Pigmented Photoresist for LCD Color Filters", Conference Record of the 1994 International Display Research Conference and International Workshops on Active–Matrix LCDs and Display Materials, pp. 165–168 (Monterey, CA, USA, Oct. 10–13, 1994).

Burpee, G. S. et al., "Laminated Structures Through Stereolithography", Presentation given at Rapid Prototyping Symposium (May 1, 1995).

Cawley, James D., "Solid Freeform Fabrication–Forming Engineering Ceramic Components Without Tooling", Progress In Ceramic Basic Science: Challenge Towards The 21$^{st}$Century, pp. 1–10 (1996).

Cesarano, Joseph III et al., "Processing of Highly Concentrated Aqueous α–Alumina Suspensions Stabilized with Polyelectrolytes", Journal of American Ceramic Society, vol. 71, No. 12, pp.1062–1067 (1988).

Garg, R. et al., "Ultraviolet Curing of Highly Loaded AluminaDispersions for Stereolithography"; Presentation given at Rapid Prototyping Symposium (May 1, 1995).

Jacobs, Paul F., Rapid Prototyping & Manufacturing: Fundamentals of Stereolithography, pp. 1–23; 397–423 (1992).

Odian, George, Principles of Polymerization, Third Edition, John Wiley & Sons, pp. 222–241 (New York, 1991).

Reed, James S., "Deflocculants and Coagulants", Principles of Ceramics Processing, Second Edition, John Wiley & Sons, p. 152 (1995).

Taylor, Lloyd D. et al., "The Photochemical Rearrangement of Polymeric N–(1–Pyridinio) Amidates. A Novel, Aqueous Photoresist System", Journal Of Polymer Science: Part C: Polymer Letters, vol. 26, pp. 177–180 (1988).

Griffith, M. L.. et al., "Ceramic Stereolithography for Investment Casting and Biomedical Application", Proc. SFF Symposium, Edited by H. L. Marcus et al., University of Texas Austin Publishers, Austin, pp. 31–38 (Sep. 1995).

Primary Examiner—Susan W. Berman

(57) ABSTRACT

A process for preparation of ceramic objects which comprises: (a) applying a layer of a high-solids photocurable ceramic composition, to a substrate, the composition comprising: (1) at least 10 percent by volume of water; (2) at least 0.05 percent by weight of photocurable compounds which are soluble or dispersible in water; and (3) at least 45 volume percent dispersed ceramic particles; and (b) subjecting the composition to sufficient ultraviolet radiation to react the compounds or polymers sufficiently to form a layer of the photocurable compounds or polymers, which is water-insoluble and non-dispersible in water, having the ceramic particles dispersed therein.

33 Claims, No Drawings

METHOD FOR PREPARING CERAMIC ARTICLES

CROSS REFERENCE TO RELATED APPLICATION

This application claims the benefit of U.S. Provisional Application No. 60/016,561, filed Apr. 30, 1996.

BACKGROUND OF THE INVENTION

This invention relates to methods for the fabrication of ceramic objects. More specifically, this invention relates to rapid freeform methods which employ a dispersion of ceramic particles in an aqueous photocurable composition.

Prototypes of articles are commonly manufactured to verify the drawings of a computer-aided design of a three-dimensional article before the article is prepared on a commercial scale. Such prototypes may be made by a variety of processes, but the need for faster processes has led to the development of stereolithographic processes employing photocurable polymers. However, it is often desirable to prepare the prototype from the composition from which the final part will be prepared so that the structural properties of the article may be tested.

Prototypes of ceramic articles are typically prepared by tooling the part from a monolithic piece of a fired ceramic or from high volume dispersions of ceramic materials by molding processes such as injection molding, and then sintered. However, these methods do not allow for the preparation of complicated shapes having internal features or small length scales.

SUMMARY OF THE INVENTION

In one aspect, the invention is a high-solids photocurable ceramic composition comprising:
(a) at least 10 percent by volume of water;
(b) at least 0.05 percent by weight of photocurable compounds or polymers that are soluble or dispersible in water; and
(c) at least 45 volume percent of dispersed ceramic particles.

In a second aspect, the invention is a process for preparing ceramic articles which comprises:
(a) applying a layer of a high-solids photocurable ceramic composition to a substrate, the composition comprising:
(1) at least 10 percent by volume of water;
(2) at least 0.05 percent by weight of photocurable compounds which are soluble or dispersible in water; and
(3) at least 45 volume percent of dispersed ceramic particles; and
(b) subjecting the composition to sufficient ultraviolet radiation to react the compounds or polymers sufficiently to form a layer of the photocurable compounds or polymers having the ceramic particles dispersed therein, which are water-insoluble and non-dispersible in water.

It has been discovered that the process of the invention permits the fabrication of ceramic articles from high-solids dispersions of ceramic particles using methods typically employed in stereolithography applications, achieving relatively high curing depths while maintaining relatively precise resolution. These and other advantages of the invention will be apparent from the description which follows.

DETAILED DESCRIPTION OF THE INVENTION

The term "photocurable" as used herein refers to compounds, polymers, or combinations thereof, which chemically react with each other in the presence of ultraviolet radiation having a wavelength in the range of from 200–400 nm at an intensity of at least 0.01 Joules/cm$^2$ (J/cm$^2$), to form compounds or polymers which are water insoluble or are non-dispersible in water, but which are stable and do not react in the absence of light for at least one day, under ambient conditions. "Water-dispersible", as used herein refers to a compound or polymer which forms a stable dispersion in water which does not separate from the water into a separate organic phase visible to the naked eye after one hour at 25° C. This photocuring occurs either by creating a three-dimensional polymer network structure that forms a solid gel, or by rendering the compounds or polymers more hydrophobic than the unreacted species to the extent that the compounds or polymers are no longer water-dispersible or water-soluble. Photocuring may occur by either of these mechanisms or by both in combination. Examples of such compositions include compounds and polymers containing photolabile onium groups such as, for example, cyclic sulfonium groups, which, in the presence of light, may react with other cyclic sulfonium groups present in the composition or other nucleophilic compounds or polymers present in the composition.

Other examples of compounds or polymers containing photolabile onium salt groups, which, upon exposure to light, react with other onium salt groups present in the composition or other nucleophilic compounds or polymers present in the composition are described in U.S. Pat. No. 5,310,581, which is hereby incorporated by reference in its entirety. Examples of compounds containing cyclic sulfonium zwitterion groups are described in U.S. Pat. No. 3,636,052 (referred to therein as cyclic sulfonium monomers and represented by the formulas shown at col. 1, line 64 to col. 2, line 20 (Formula II)); U.S. Pat. Nos. 3,723,386; 4,089,877 (referred to therein as zwitterions prepared from hydroxyarylpolymethylene sulfonium salt and represented by the formula shown at col. 2, lines 10–32); and U.S. Pat. No. 4,118,297 (referred to therein as polymerizable ar-cyclic sulfonium, fused polynuclear areneoxides and represented by the formula described at col. 1, lines 28–65), all of which are hereby incorporated by reference. Preferably, the cyclic sulfonium zwitterion is bisphenol A zwitterion (1,1 '[(1-methylethylidene)bis(6-hydro-3,1-phenylene)]bis[tetrahydrothiophenium],dihydroxide,bis(innersalt). Examples of compounds containing photolabile onium salt groups are described, for example, in U.S. Pat. No. 5,310,581, (which is hereby incorporated by reference in its entirety) as having an average of more than one photolabile onium group bonded to a chromophore group via a linking group. Examples of nucleophilic compounds or polymers which may undergo a photo-assisted reaction with a cyclic sulfonium zwitterion or a photolabile onium salt group include those containing pendant carboxylate, alkoxide, phenoxide, and other groups described in U.S. Pat. No. 5,310,581 and identified as photoreactive nucleophile groups. In one embodiment of the invention, if the photocurable polymers contain photocurable groups other than photolabile onium groups, such other groups preferably comprise no more than 5 mole percent of the photocurable groups present in the composition, more preferably less than 1 mole percent.

The composition preferably contains enough photocurable groups to render the ceramic dispersion hydrophobic in those areas exposed to ultraviolet radiation and thereby imparting sufficient strength to the ceramic composition that the unexposed areas can be rinsed away. The resulting freeform ceramic green body has sufficient green strength so that it can be handled without significant damage during the sintering process. The cured ceramic composition preferably forms a "water-resistant layer" thereof, which is a solid, water-insoluble layer of material comprised of the reaction products of the photocurable components having a minimum dimension in the range of from 1 $\mu$m to 400 $\mu$m, although it may itself contain minor amounts of water. When the photocurable polymers are photocured, they form species which are water-insoluble and hydrophobic. The compounds or polymers having pendant or photocurable onium groups are preferably employed in an amount, based on the weight of the dry ceramic particles dispersed in the aqueous fluid, of at least about 0.05 weight percent, more preferably at least about 0.1 weight percent; but is preferably no greater than 10 weight percent, more preferably no greater than 5.0 weight percent.

Other examples of photocurable compounds or polymers include materials that contain reactive vinyl groups that can be polymerized by free radical initiation. To form insoluble gels, these materials must contain a fraction of the curable species with multiple reactive vinyl groups. Monofunctional species (compounds or polymers containing only one unsaturated group) may be employed in minor amounts. Such monofunctional compounds or polymers will copolymerize with the curable species containing multiple reactive unsaturated groups and create a polymer matrix with sufficient physical integrity to remain in place during the multistep-process for preparing the desired article. However, the amount of monofunctional species, based on the combined weight of the monofunctional and multifunctional species, is preferably no greater than 50 percent by weight, and more preferably no greater than 10 percent by weight. The photocurable compound or polymers are preferably water-soluble or soluble in an aqueous solution of alcohol, ethylene glycol, propylene glycol or other aqueous miscible cosolvents such that the aqueous phase is at least 50 percent by weight water, and most preferably 90 to 100 percent. The photocurable species is used between 5 and 60 percent by weight of the aqueous solution. Examples of photocurable species include polyethylene glycol dimethacrylate, polyethylene glycol diacrylate, polypropylene glycol monomethacrylate, ethoxylated trimethylopropane triacrylate, ethoxylated bisphenol A dimethacrylate, and methylene bisacrylamide. A free radical initiator for this addition polymerization process is preferably added to systems that are activated by UV light having a wavelength in the range of from 200–400 nm. Examples of initiators include 2-hydroxy-4'-(2-hydroxyethoxy)-2-methylpropiophenone (Aldrich Chemical), 4-[2-hydroxyethoxy]phenyl-[2-propyl]ketone (Irgacure™ 2959, Ciba Geigy), 2-hydroxy-2-methyl-1-phenyl-propan-1-one (Darocur™ 1173, Ciba Geigy). These initiators may be used singly, in combination or with sensitizers as is well known to one skilled in the art. These initiators are used at levels of 0.001 to 4 weight percent with respect to the aqueous phase. Other process conditions which may be desirable for addition polymerization processes are described in Odian, George, Principles of Polymerization, Third Ed., pp. 222–241, John Wiley & Sons, (New York, 1991), which is herein incorporated by reference.

The term "ceramic" as used herein means fine powders of inorganic materials that can be sintered to form a solid ceramic part that is useful in structural ceramics, ceramic composites, electronic ceramics or ceramic coatings. Examples of ceramic powders include, but are not limited to, fine powders of alumina ($Al_2O_3$), zirconia ($ZrO_2$), boron carbide ($B_4C$), boron nitride (BN), barium titanate ($BaTiO_3$), and silicon nitride ($Si_3N_4$). The ceramic can also contain more than one type of inorganic material, and may contain other fine particles, such as metals, or small fibers for the purpose of forming alloys or composites in order to obtain the desired properties of the final ceramic part. The particles of ceramic material preferably have an average diameter of greater than 0.05 micron, more preferably greater than 0.1 micron, but is not greater than 10 microns, and preferably no greater than 2 microns. Such particles are present in the composition in an amount based on the volume of the composition of greater than 45 percent, more preferably greater than 50 percent, and most preferably greater than 55 percent, but not greater than an amount that will allow the ceramic dispersion in the aqueous curing composition to have a low enough viscosity that a coating having a thickness of less than 400 microns may be easily prepared therefrom.

Preferably, the compositions described herein contain a compound or polymer which functions as a dispersing agent for the ceramic particles, which helps keep them dispersed and helps minimize the viscosity of the ceramic dispersion. Certain of the photocurable polymers described above may contain groups which permit such polymer to function as a dispersing agent for ceramic particles. In one preferred embodiment, the polymer contains both photocurable groups and pendant ionic groups. Examples of such polymers are described in U.S. patent application Ser. No. 106,603, filed Dec. 20, 1979, now abandoned, which was a continuation-in-part of application Ser. No. 901,925, filed May 1, 1978, now abandoned, both of which are incorporated herein by reference.

However, if the photocurable polymer or compound does not function as a dispersing agent for the ceramic particles, the composition also preferably contains a separate compatible dispersing agent. The choice of a suitable dispersant will depend on the acidity of the ceramic particle to be dispersed and the pH of the composition which does not contain any dispersant. For example, if the ceramic particles have an isoelectric point of greater than 6, the composition preferably contains a poly(methacrylic acid) having a weight average molecular weight in the range of from 5,000 to 15,000, citric acid, or a $C_{18}$-$C_{30}$ alkyl or alkylaryl sulfonate in an amount, based on the dry surface area of the ceramic particles, of at least 0.5 mg/m$^2$. If the ceramic particles have an isoelectric point of less than 6, the composition preferably contains a polyethylene imine or a $C_{12}$-$C_{30}$ alkyl- or alkyleneoxy-substituted amine or quaternary ammonium salt. The isoelectric point for a ceramic powder is the pH value of an aqueous medium containing the powder, which at the surface of the powder has zero net charge. This value can be readily determined by measuring the electrophoretic mobility of the dispersed particles. The isoelectric points for many ceramic powders are known and are described, for example, in Reed, James S., *Principles of Ceramic Processing*, 2$^{nd}$ Ed., Wylie Interscience, New York (1962). When the isoelectric point of the ceramic powder is greater than 6 and a poly(methacrylic acid) is used as the dispersant in its ammonium salt form, this material is compatible with the bisphenol A zwitterion and, upon exposure to ultraviolet radiation of about 330 to 360 nm will react with the bisphenol A zwitterion to form a hydrophobic, highly-crosslinked network. Alternatively, the polymeric dispersant can be designed to include both photolabile onium salt groups and other nucleophilic groups, such as carboxylate, which upon exposure to light, undergo a photocuring reaction with each other. The dispersing agent is preferably present in an amount sufficient to form a relatively stable dispersion of the ceramic particles, but since such polymers may be relatively hydrophilic, they are preferably not used in excessive amounts. Preferably, the dispersing agent is employed in an amount, based on the dry surface area of the ceramic particles, of 0.5 to 2 mg/m$^2$. The amount of dispersing agent required may be dependent on the pH of the ceramic dispersion. For example, for alumina, the amount of dispersing agent is dependent on the pH of the composition, with higher amounts of dispersing agent required at lower pH ranges. Preferably, the dispersing agent is employed in an amount, based on the dry surface area of the ceramic particles, of 0.5 to 1.0 mg/m$^2$ at a pH of 9, or about 1 to 2 mg/m$^2$ at a pH of about 5.

The term "aqueous" as used herein means a composition that contains water. Other water-miscible materials may be included in the composition as long as they do not adversely interfere with the dispersion of the ceramic particles, the viscosity of the dispersion, or the photocuring of compounds or polymers present in the composition. Such water-miscible materials include, but are not limited to various inorganic electrolytes, such as alkali metal salts, or water-soluble organic materials such as alcohols, ethylene glycol, or glycerin. Inorganic materials are preferably present in the composition in only small amounts, for example, less than 5 weight percent and preferably less than 2 weight percent, based on the dry ceramic powder, and organic materials are preferably present in amounts of less than 50 volume percent and preferably less than 10 volume percent based on the volume of the aqueous fluid.

The process can be carried out by using standard stereolithography fabrication techniques. An example of such a machine useful in such processes is that currently sold by 3D Systems Corporation for selective photopolymerization of a monomer. Stereolithographic processes are described in Jacobs, Paul F, *Rapid Prototyping and Manufacturing:Fundamentals of Stereolithography*, (Society of Manufacturing Engineers, 1992), which is hereby incorporated by reference in its entirety.

The use of the composition of the invention permits the preparation of ceramic articles having relatively precise and well-defined dimensions. In processes for the preparation of ceramic articles from aqueous ceramic dispersions, layers of the ceramic dispersion are deposited on a suitable substrate and the photocurable polymers therein are cured with ultraviolet light. The cured layer(s) are then washed with a suitable washing fluid, such as water, to remove the uncured portion of the dispersion, with the cured portion remaining in place. The thickness of the cured layer and the profile of the cured layer in a direction perpendicular to the direction of the light beam will depend on several factors, including the particular photocurable polymer employed, the concentration of the ceramic particles, the intensity and wavelength of the light, and the shape of the light beam utilized. The profile of the photocured layer which is achievable for a given photocurable polymer may be determined by applying a 40 μm thick layer of the dispersion to a suitable substrate, directing a focused light beam on a portion of the layer in a direction which is perpendicular to the substrate to which the dispersion was applied and is adjacent to a portion of the layer which is not exposed to such light (such as by way of a contact mask), washing the cured portion under conditions sufficient to remove the uncured portion of the composition, and analyzing the resulting profile to determine its slope relative to a direction parallel to the beam of light. The optimum photocurable polymer will produce a profile which is as close to parallel to the light source as possible. In addition, the use of photolabile onium-functional compounds or polymers does not require the use of a separate dispersing agent.

The following examples are for illustrative purposes only and are not intended to limit the scope of this invention. Unless stated otherwise, all parts and percentages are given by weight.

EXAMPLE 1

A dispersion of alumina particles is prepared by mixing alumina particles having an average diameter of 0.15 μm and a surface area of 5.0 m$^2$/g (A-16SG, available from Alcoa, 78.08 weight percent) with an aqueous solution of bisphenol A zwitterion (the dispersion containing 0.96 weight percent bisphenol A zwitterion and 20.57 percent water) and the ammonium salt of poly(methacrylic acid) (Darvon™ C, molecular weight: 15,000, available from R.T. Vanderbilt Co., Inc., 0.39 weight percent).

A 1-mil (0.0254 cm) thick coating of the dispersion is cast onto a glass microscope slide and half of the coating is masked with foil. The composition is subjected to ultraviolet radiation supplied by lamp model IR 1000F having a model PC10-1-H2 200 WPI power supply (American Ultraviolet Company) for 3 minutes. A flux of 0.85 J/cm$^2$ is measured using a Uvicure™ UV Curing Radiometer (Electronics Instrument & Technology, Sterling, Va.). The slide is unmasked and a second 1-mil coating of the dispersion is applied to the slide. The half of the slide previously masked is re-masked and the slide is subjected to ultraviolet radiation for an additional 3 minutes. This procedure is repeated to apply a third coating of the dispersion which is subjected to ultraviolet radiation for 3 minutes. The masking is then removed immediately and the slide is rinsed with a spray of deionized water from a wash bottle. Almost all of the portion of the dispersion applied to the masked portion of the slide is removed by the rinsing. The portion which had been subjected to ultraviolet light does not wash off at all in the water spray, nor does it rub off when lightly scrubbed with a wet cotton swab.

EXAMPLE 2

Three dispersions of alumina particles are prepared by combining alumina AKP-30 (0.39 micron average particle size) at 50 volume percent with Darvon™ C poly (methacrylic acid) at 1.0 weight percent with water and bisphenol A zwitterion. The dispersions contain 2.0, 4.0 and 5.0 weight percent bisphenol A zwitterion, based on the dry ceramic powder, respectively. The pH of the solutions is adjusted to about 9 while making the dispersions and before curing, it is raised to 10 to 11 using ammonium hydroxide.

Curing is effected using a LWUV lamp (model Blak Ray B-100A). A few drops of the ceramic dispersion are placed between cover glasses that did not absorb the UV radiation used for the cure. The dispersions are exposed for different times and then immediately washed with water. The top section is cured and beneath the cured section, the uncured ceramic dispersion is washed away. Thickness measurements of the cured ceramic dispersions are made using a scanning electron microscope. The cured sections exhibit adequate mechanical strength to be handled for sample preparation.

| Zwitterion Concentration, weight percent | Dose, mjoules/cm² | Depth of Curing, microns |
|---|---|---|
| 2 | 330 | 37 |
| 2 | 160 | 21 |
| 4 | 40 | 8 |
| 5 | 360 | 130 |

EXAMPLE 3

Two dispersions of alumina particles are prepared by combining alumina AKP-30 (0.39 micron average particle size) at 50 volume percent with Darvon C poly(methacrylic acid) at 1.0 weight percent with water and bisphenol A zwitterion. The first dispersion contains 2.0 weight percent bisphenol A zwitterion and the second contains 0.4 weight percent bisphenol A zwitterion.

Curing is accomplished by using a 3-D Systems Inc. stereolithography machine with the standard He-Cd 35 mW laser. The laser has a wavelength of 325 nm. The curing dose is controlled by the computer program by varying the writing speed of the laser bean across the surface. The ceramic dispersions are coated onto a microscope slide using a blade coater. A glass-cover slip is placed on top of the coating. The laser beam cures the dispersion through the cover slip. After exposure, the cover slip is washed with water to remove the uncured dispersion and the cured ceramic is air dried. Thickness of the dry-cured section adhering to the cover slip is measured using a profilometer. A sharp pattern with a cured depth of 5 to 6 microns is obtained using a curing energy of 0.014 J/cm².

EXAMPLE 4

A polymeric dispersant containing photocurable groups was prepared by a free radical solution polymerization using a continuous addition process. The polymerization is carried out in a 1 liter glass flask equipped with a stirrer, condenser, and 3 addition ports. To the flask is added 200 grams of t-butyl alcohol and this is heated to 65° C. Three streams are continuously added to the flask over a period of 3 hours while the temperature is maintained at 65° C. The first stream is a solution of 23.77 grams of vinylbenzyl chloride in 50.00 grams of t-butyl alcohol. The second stream is 76.2 grams of methacrylic acid. The third stream is a solution of 2.5 grams of VaZo™ 52 initiator (pentanenitrile,2,4-dimethyl, 2,2'azobis; from DuPont, Wilmington, Del.) plus 47.5 grams of t-butyl alcohol. After the 3-hour addition period, the solution is heated an additional 3 hours at 65° C. The bath is next cooled to 35° C. and 401.3 grams of 23 weight percent trimethylamine in water plus 675 grams of water are added to the flask. The flask is stirred overnight at 35° C. The result is a clear, slightly yellow, aqueous solution of the poly(methacrylic acid/vinylbenzyltrimethyl ammonium chloride). The final concentration of the polymer is 9.5 weight percent solids. The polymer solution is then dialyzed to remove unreacted trimethylamine and t-butyl alcohol using a 3500 molecular weight cut-off natural cellulose Spectra/Por dialysis tube (Specrum Brand). After dialysis, the polymer is vacuum filtered by using a filter mat prepared by alternating layers of Celite™ filter aid (Manville Corp., Denver, Colo.) between Whatman "Qualitative" No. 1 filter paper (Whatman Limited). The resulting solution is clear and has a solids content of 16.4 weight percent. The weight average molecular weight of the polymer is determined by size exclusion chromatography to be 7800 based on polystyrene calibration.

An aqueous dispersion is prepared by slowly adding 42.36 grams of boron carbide (5 micron average particle size) to 21.96 grams of water containing 3.04 grams of the above 16.4 weight percent aqueous solution of poly(methacrylic acid/vinylbenzyltrimethyl ammonium chloride) using a Cowles-type mixing blade rotating at about 2000 rpm. An easily pourable dispersion results. A layer of 0.001-inch thick is cast onto a glass slide. One-half of the layer is covered with aluminum foil and the slide is exposed to 0.85 J/cm² from a medium pressure mercury vapor lamp (Model IR 1000F having a PC10-1-H2 200 WPI power supply, American Ultraviolet Company). The aluminum foil is removed from the slide and the slide is rinsed with a spray of deionized water. The part of the layer covered by the aluminum foil washes off the slide whereas that exposed by the ultraviolet radiation remains on the slide.

A second aqueous dispersion is prepared in the same manner using 42.36 grams of boron carbide (5 micron average particle size) to 20.44 grams of deionized water plus 4.56 grams of the above 16.4 weight percent aqueous solution of poly(methacrylic acid/vinylbenzyltrimethyl ammonium chloride). A layer of 0.001-inch thick (0.0254 cm) is cast onto a glass slide. One-half of the layer is covered with aluminum foil and the slide is exposed to 0.85 J/cm² from a medium pressure mercury vapor lamp (Model IR 1000F having a PC10-1-H2 200 WPI power supply, American Ultraviolet Company). The aluminum foil is removed from the slide and the slide is rinsed with a spray of deionized water. The part of the layer covered by the aluminum foil washes off the slide whereas that exposed by the ultraviolet radiation remains on the slide.

EXAMPLE 5

A dispersion of alumina particles was prepared by combining alumina (AKP-20; 0.4 micron average particle size) at 54.1 volume percent with an aqueous solution of 9 parts by weight water to 1 part by weight tertiary butyl alcohol with poly(methacrylic acid) (Darvon C) at 0.25 weight percent with respect to alumina powder and 2-hydroxy-4'-(2-hydroxyethoxy)-2-methylpropiophenone (available from Aldrich Chemical) at 0.07 weight percent with respect to the aqueous solution. To this was added 10 weight percent with respect to powder SR344 polyethylene glycol diacrylate (available from Sartomer Inc., Exton, Pa.). A flowable fluid dispersion was obtained. This fluid dispersion was used to fabricate a ceramic green body by laser stereolithography using a SLA 250 machine (available from 3-D Systems Inc., Valencia CA). The dispersion was photocured with a 30 mW He-Cd laser using a beam writing speed that resulted in a maximum exposure energy of 370 mJ/cm². Sequential curing and layering of 63 layers each of 150 micron thickness was used to fabricate a six-bladed turbine that was 1.5 inches in diameter by 0.37-inch thick from a computer aided design file supplied by 3-D Systems. The turbine was dried and sintered at 1500° C. to 98+% of theoretical density.

What is claimed is:

1. A high-solids photocurable ceramic composition comprising:
   (a) at least 10 percent by volume of water;
   (b) at least 0.05 percent by weight of photocurable compounds or polymers that are soluble or dispersible in water, which photocurable compounds or polymers chemically react with each other in the presence of ultraviolet radiation having a wavelength in the range of from 200–400 nanometers at an intensity of at least 0.01 joules per square centimeter, to form compounds or polymers which are more hydrophobic than the unreacted photocurable compounds or polymers, but which photocurable compounds or polymers are stable and do not react in the absence of light for at least one day, under ambient conditions; and (c) at least 45 volume percent of dispersed ceramic particles.

2. The composition of claim 1 wherein the ceramic particles have an isoelectric point of greater than 6 and the composition additionally comprises an anionic compound or polymer in an amount, based on the dry surface area of the ceramic particles, of at least 0.5 mg/m$^2$.

3. The composition of claim 1 wherein the ceramic particles have an isoelectric point of less than 6 and the composition additionally comprises a cationic compound or polymer in an amount, based on the dry surface area of the ceramic particles, of at least 0.5 mg/m$^2$.

4. The composition of claim 1 wherein component (c) is present in an amount of at least 50 volume percent.

5. The composition of claim 1 wherein component (c) is present in an amount of at least 55 volume percent.

6. A high-solids photocurable ceramic composition comprising:

(a) at least 10 percent by volume of water;
(b) at least 0.05 percent by weight of compounds or polymers having at least two pendant photolabile onium groups per molecule, which are soluble or dispersible in water, and
(c) at least 45 volume percent of dispersed ceramic particles.

7. The composition of claim 6 wherein the ceramic particles have an isoelectric point of greater than 6 and the composition additionally comprises an anionic compound or polymer in an amount, based on the dry surface area of the ceramic particles, of at least 0.5 mg/m$^2$.

8. The composition of claim 7 wherein the anionic compound or polymer has at least two carboxylic acid groups per molecule.

9. The composition of claim 6 wherein the ceramic particles have an isoelectric point of less than 6 and the composition additionally comprises a cationic compound or polymer in an amount, based on the dry surface area of the ceramic particles, of at least 0.5 mg/m$^2$.

10. The composition of claim 6 wherein component (c) is present in an amount of at least 50 volume percent.

11. The composition of claim 6 wherein component (c) is present in an amount of at least 55 volume percent.

12. The composition of claim 6 wherein component (b) comprises water-soluble or water-dispersible compounds or polymers containing pendant cyclic sulfonium zwitterion groups.

13. A high-solids photocurable ceramic composition comprising:

(a) at least 10 percent by volume of water;
(b) at least 0.05 percent by weight of compounds or polymers having at least two unsaturated groups per molecule, and
(c) at least 45 percent by volume of dispersed ceramic particles.

14. The composition of claim 13 wherein the ceramic particles have an isoelectric point of greater than 6 and the composition additionally comprises an anionic compound or polymer in an amount, based on the dry surface area of the ceramic particles, of at least 0.5 mg/m$^2$.

15. The composition of claim 13 wherein the ceramic particles have an isoelectric point of less than 6 and the composition additionally comprises a cationic compound or polymer in an amount, based on the dry surface area of the ceramic particles, of at least 0.5 mg/m$^2$.

16. The composition of claim 13 wherein component (c) is present in an amount of at least 50 volume percent.

17. The composition of claim 13 wherein component (c) is present in an amount of at least 55 volume percent.

18. A process for the preparation of ceramic objects which comprises:

(a) applying a layer of a high-solids photocurable ceramic composition, to a substrate, the composition comprising:
  (1) at least 10 percent by volume of water;
  (2) at least 0.05 percent by weight of photocurable compounds or polymers that are soluble or dispersible in water, which photocurabic compounds or polymers chemically react with each other in the presence of ultraviolet radiation having a wavelength in the range of from 200–400 nanometers at an intensity of at least 0.01 joules per square centimeter, to form compounds or polymers which are more hydrophobic than the unreacted photocurable compounds or polymers, but which photocurable compounds or polymers are stable and do not react in the absence of light for at least on day, under ambient conditions; and
  (3) at least 45 volume percent of dispersed ceramic particles: and
(b) subjecting the composition to sufficient ultraviolet radiation to react the compounds or polymers sufficiently to form a layer of the photocurable compounds or polymers having the ceramic particles dispersed therein, which is insoluble and non-dispersible in water.

19. The process of claim 18 wherein the ceramic particles have an isoelectric point of greater than 6 and the composition additionally comprises an anionic compound or polymer in an amount, based on the dry surface area of the ceramic particles, of at least 0.5 mg/m$^2$.

20. The process of claim 18 wherein the ceramic particles have an isoelectric point of less than 6 and the composition additionally comprises a cationic compound or polymer in an amount, based on the dry surface area of the ceramic particles, of at least 0.5 mg/m$^2$.

21. The process of claim 18 wherein component (3) is present in an amount of at least 50 volume percent.

22. The process of claim 18 wherein component (3) is present in an amount of at least 55 volume percent.

23. The process of claim 18 wherein component (2) comprises water-soluble or water-dispersible compounds or polymers having at least two pendant photolabile onium groups per molecule.

24. The process of claim 23 wherein the ceramic particles have an isoelectric point of greater than 6 and the composition additionally comprises an anionic compound or polymer in an amount, based on the dry surface area of the ceramic particles, of at least 0.5 mg/m$^2$.

25. The process of claim 24 wherein the anionic compound or polymer has at least two carboxylic acid groups per molecule.

26. The process of claim 23 wherein the ceramic particles have an isoelectric point of less than 6 and the composition additionally comprises a cationic compound or polymer in an amount, based on the dry surface area of the ceramic particles, of at least 0.5 mg/m$^2$.

27. The process of claim 23 wherein component (3) is present in an amount of at least 50 volume percent.

28. The process of claim 23 wherein component (3) is present in an amount of at least 55 volume percent.

29. The process of claim 18 wherein component (2) comprises water-soluble or water-dispersible compounds or polymers having at least two unsaturated groups per molecule.

30. The process of claim 29 wherein the ceramic particles have an isoelectric point of greater than 6 and the composition additionally comprises an anionic compound or polymer in an amount, based on the dry surface area of the ceramic particles, of at least 0.5 mg/m$^2$.

31. The process of claim 29 wherein the ceramic particles have an isoelectric point of less than 6 and the composition additionally comprises a cationic compound or polymer in an amount, based on the dry surface area of the ceramic particles, of at least 0.5 mg/m$^2$.

32. The process of claim 29 wherein component (3) is present in an amount of at least 50 volume percent.

33. The process of claim 29 wherein component (3) is present in an amount of at least 55 volume percent.

* * * * *